United States Patent
Bruckhaus

(10) Patent No.: US 10,320,359 B2
(45) Date of Patent: Jun. 11, 2019

(54) SIGNAL PROCESSING DEVICE AND CONTROL DEVICE

(71) Applicant: Robert Bosch GmbH, Stuttgart (DE)

(72) Inventor: Tim Bruckhaus, Asperg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/574,940

(22) PCT Filed: Apr. 8, 2016

(86) PCT No.: PCT/EP2016/057693
§ 371 (c)(1),
(2) Date: Nov. 17, 2017

(87) PCT Pub. No.: WO2016/184605
PCT Pub. Date: Nov. 24, 2016

(65) Prior Publication Data
US 2018/0175818 A1 Jun. 21, 2018

(30) Foreign Application Priority Data

May 21, 2015 (DE) .................. 10 2015 209 277

(51) Int. Cl.
*G05F 3/08* (2006.01)
*H03H 7/06* (2006.01)
(Continued)

(52) U.S. Cl.
CPC ............... *H03H 7/06* (2013.01); *G05F 3/08* (2013.01); *H03H 1/02* (2013.01); *H03H 7/427* (2013.01); *H02P 6/00* (2013.01)

(58) Field of Classification Search
CPC ............ H03H 1/02; H03H 7/06; H03H 7/427; G05F 3/08; H02P 6/00
See application file for complete search history.

(56) References Cited

U.S. PATENT DOCUMENTS

| 6,342,815 B1 * | 1/2002 | Kobayashi ............... H03F 1/56 330/286 |
| 7,649,409 B1 | 1/2010 | Koh et al. |
| 2014/0256276 A1 | 9/2014 | Li et al. |

FOREIGN PATENT DOCUMENTS

| DE | 3804331 | 2/1989 |
| EP | 2837915 | 2/2015 |

(Continued)

OTHER PUBLICATIONS

FR2653281 (Year: 1989).*

(Continued)

*Primary Examiner* — Muhammad S Islam
(74) *Attorney, Agent, or Firm* — Michael Best & Friedrich LLP

(57) ABSTRACT

The present invention discloses a signal processing device for processing a differential signal from a sensor at a prescribed signal frequency, having a positive signal input (5-1), which is couplable to a positive sensor output of the sensor, and a negative signal input (6-1), which is couplable to a negative sensor output of the sensor, having a positive signal output (7-1) and having a negative signal output (8-1), having a first frequency-dependent resistance (C1H) between the positive signal input (5-1) and the positive signal output (7-1) and having a second frequency-dependent resistance (C1L) between the negative signal input (6-1) and the negative signal output (8-1), wherein the first and second frequency-dependent resistances (C1H, C1L) are designed to allow electrical signals at the prescribed signal frequency to pass in approximately unattenuated fashion, having a first voltage divider (11), which is arranged at least in part in parallel with the first frequency-dependent resistance (C1H) and is designed to divide a voltage between the positive signal input (5-1) and the positive signal output (7-1) using a prescribed ratio, having a second voltage (Continued)

divider (12), which is arranged at least in part in parallel with the second frequency-dependent resistance (C1L) and is designed to divide a voltage between the negative signal input (6-1) and the negative signal output (8-1) using a prescribed ratio. Further, the present invention discloses a control device for an electric machine.

11 Claims, 4 Drawing Sheets

(51) Int. Cl.
*H03H 1/02* (2006.01)
*H03H 7/42* (2006.01)
*H02P 6/00* (2016.01)

(56) References Cited

FOREIGN PATENT DOCUMENTS

FR 2653281 4/1991
GB 515843 2/1939

OTHER PUBLICATIONS

Linear Interface for an information transmission netwrok (Year: 1989).*
International Search Report for Application No. PCT/EP2016/057693 dated Jun. 28, 2016 (English Translation, 3 pages).
Kumar, U et al., "A survey of dual input RC notch filters," Microelectronics Journal, Mackintoshj Publications Ltd Luton, GB, Bd. 22, Nr. 1, Jan. 1, 1991, Seiten 31-47, XP000205220.
Bishay, A.G. et al., "Effect of strain on the frequency-department resistance of island gold films", Journal of Materials Science: Materials in Electronics, Kluwer Academic Publishers, BO, vol. 17, No. 1, Jan. 1, 2006, pp. 71-77, XP019211907.

* cited by examiner

SIGNAL PROCESSING DEVICE AND CONTROL DEVICE

BACKGROUND OF THE INVENTION

The present invention relates to a signal processing device for processing a differential signal from a sensor and a corresponding control device.

Although the present invention is depicted below primarily in connection with sensors for electric machines, said invention is not limited thereto. The present invention can in fact be used in every system in which differential signals are evaluated.

Electric machines, e.g. electric motors, are used today in a variety of applications. For example, electric motors can be used as the driving motors in electric vehicles.

In order to control such electric machines, it is necessary to know the position, respectively the position of the rotor of such an electric machine. In order to acquire the position of the rotor, position sensors, such as, e.g., resolvers can, for example, be used. The output signals of these position sensors can then, e.g., be evaluated by a microcontroller and thereby the position of the rotor of the electric machine can be determined.

Depending on the application, it is required that the signals of the position sensor lie in all relevant operating conditions within the input parameters of the microcontroller. It is furthermore frequently required that the information necessary for a diagnosis be acquired in the case of a fault.

The European patent publication EP 2 837 915 A1 shows a motor control having a corresponding resolver monitoring.

SUMMARY OF THE INVENTION

The present invention discloses a signal processing device and a control device.

Provision is accordingly made for:

a signal processing device for processing a differential signal of a sensor at a prescribed signal frequency, having a positive signal input, which is couplable to a positive sensor output of the sensor, and a negative signal input, which is couplable to a negative sensor output of the sensor, having a positive signal output and having a negative signal output, having a first frequency-dependent resistance between the positive signal input and the positive signal output and having a second frequency-dependent resistance between the negative signal input and the negative signal output, wherein the first and second frequency-dependent resistances are designed to allow electrical signals at the prescribed signal frequency to pass in approximately unattenuated fashion, having a first voltage divider, which is arranged at least in part parallel with the first frequency-dependent resistance and is designed to divide a voltage between the positive signal input and the positive signal output using a prescribed ratio, and having a second voltage divider, which is arranged at least in part in parallel with the second frequency-dependent resistance and is designed to divide a voltage between the negative signal input and the negative signal output using a prescribed ratio.

Provision is furthermore made for:

a control device for an electric machine, having a signal processing device according to one of the preceding claims, and having a computing device, which has a first analog-digital converter which is coupled to the positive signal output of the signal processing device, and which has a second analog-digital converter which is coupled to the negative signal output of the signal processing device.

A differential signal refers in this case to a signal which is transmitted via two signal lines. The actual information content is characterized by the difference in the voltages or the currents of the two signal lines. Sensors can, e.g., output a differential signal to two signal lines at a prescribed signal frequency, i.e. output, e.g., an AC voltage. A prescribed signal frequency can refer in this case not only to an individual frequency but also to a frequency range around the indicated frequency having a prescribed width. This frequency range is also denoted as the useful frequency range. The differential signal can thereby relate to the difference of a voltage, a current, however, e.g., also to a difference in the phase of the signal profiles on the two signal lines.

Sensors as used here can be any type of sensor which outputs a differential signal, in particular an AC voltage signal, the frequency of which is known or the signal components of which lie in a known useful frequency range. For example, a sensor can be an angle sensor or respectively a position sensor, such as, e.g., a resolver. A sensor within the scope of this patent application can, however, also, e.g., be a microphone or another audio source or the like. The difference between a positive and a negative sensor output or respectively a positive and a negative signal input and output serves primarily the logical difference. The terms "positive" or "negative" do not however necessarily describe a polarity or the like.

A frequency-dependent resistance can, e.g., refer to a capacitor within the scope of this patent application, the resistance of which or respectively the impedance value depends on the frequency of the voltage applied to the capacitor. The capacitor therefore acts like an AC current resistance with a frequency-dependent impedance value. The term "to pass in unattenuated fashion" is to be understood in this context that the respective signal is dampened only to a lesser extent. A small dampening is however possible on account of, e.g., parasitic resistances or the like. Within the scope of this patent application, the voltage dividers denote substantially such voltage dividers that are based on real resistances.

The insight underlying the present invention is that the connection of the sensor to a computing device provides only a limited robustness against shunts. Shunts are thereby to be understood as parasitic resistances between a signal line of the sensor and a voltage which lies between ground and the operating voltage. Operating voltage refers in this case to the operating voltage of the entire system. Said operating voltage of the entire system usually lies between 12V-14V in vehicles.

The idea underlying the present invention is to take this insight into account and to provide an improved circuit for the signal processing of differential sensor signals.

To this end, the present invention processes the differential signal so that the amplitude of the useful signal, i.e. the alternating component of the signal outputted by the sensor remains intact for the most part. To this end, frequency-dependent signal resistances are used in the positive signal path as well as in the negative signal path, said frequency-dependent signal resistances allowing electrical signals at the prescribed signal frequency to pass in approximately unattenuated fashion.

At the same time, the direct current component is however is divided down by the voltage divider, e.g. by a factor of 3, respectively to 30%. The direct current components of the signals through the signal divider are consequently strongly divided down but still transmitted. To this end, at least a part of each of the voltage dividers is connected in parallel to the corresponding frequency-dependent resistance. If capacitors are used as frequency-dependent resistances, these represent an interruption for the direct current component. Only the resistances of the voltage divider are thus operative for the direct current components. For instance, respectively one of the resistances of the corresponding voltage divider can be arranged in parallel to the frequency-dependent resistance.

The present invention provides a high robustness with respect to the shunts by means of the sharp reduction in the direct current component of the sensor signals. A shunt increases or decreases the direct current potential at the signal outputs only to a very small amount. At the same time, the signal amplitude of the alternating component of the sensor signals is, however, only dampened to a small degree, whereby said signal amplitude is only prone to disturbance and failure to a very small extent.

At the same time, a diagnosis of faults in the signal lines is furthermore possible with the aid of the present invention in contrast to a pure alternating voltage coupling of the sensor. Such faults can, e.g, be short circuits in the signal lines to ground or to the supply voltage, line interruptions of the like.

During normal operation, i.e without a fault or shunt, the actual sensor signals are only weakly dampened. The DC voltage potentials at the signal outputs consequently depend only on the signal processing device itself. These can, e.g., lie approximately at half of the reference voltage of the analog-digital converter in the computing device, which enables an upward and downward maximum amplitude for the actual sensor signals or respectively the alternating component of the sensor signals.

In an operation having a shunt, the DC voltage potentials are slightly increased or decreased. If the voltage divider is appropriately dimensioned, the entire amplitude of the sensor signals continues to remain available.

Advantageous embodiments and modifications ensue from the claims as well as from the description with reference to the figures in the drawings.

In one embodiment, the signal processing device can have a first low-pass filter, which is arranged between the positive signal input and the positive signal output and is designed to allow signals at the prescribed signal frequency to pass in approximately unattenuated fashion.

In one embodiment, the signal processing device can have a second low-pass filter which is arranged electrically between the negative signal input and the negative signal output and is designed to allow electrical signals at the prescribed signal frequency to pass in approximately unattenuated fashion.

High frequency interference signals, which, e.g., are coupled between the sensor and the signal processing device, can be filtered out by the first and the second low-pass filter.

In one embodiment, the signal processing device can have a voltage supply connection and a ground connection. In addition, the signal processing device can have a resistance network, which is arranged between the first voltage divider and the second voltage divider and the voltage supply connection and the ground connection and is designed to adjust a DC voltage at the positive signal output and the negative signal output to a prescribed value. The resistance network enables the DC voltage potential to be exactly adjusted at the signal outputs.

In one embodiment, a first resistance of the first voltage divider can be arranged in parallel to the first frequency-dependent resistance. Furthermore, a second resistance of the first voltage divider can be arranged between the first resistance of the first voltage divider and the positive signal output, and a third resistance of the first voltage divider can be arranged between the second resistance of the first voltage divider and a ground connection. The first signal output can, e.g., be coupled to a node between the second resistance and the third resistance.

In one embodiment, a first resistance of the second voltage divider can be arranged in parallel to the second frequency-dependent resistance. In addition, a second resistance of the second voltage divider can be arranged between the first resistance of the second voltage divider and the negative signal output, and a third resistance of the second voltage divider can be arranged between the second resistance of the second voltage divider and a ground connection. The second signal output can, e.g., likewise be coupled to a node between the second resistance and the third resistance.

By means of the parallel arrangement of the first resistance of the respective voltage divider in parallel to the second frequency-dependent resistance, the first resistance is in each case only operative for the DC voltage component of the respective signal. Said first resistance can consequently be selected high so that the desired division ratio is adjusted in the respective voltage divider. The alternating component of the respective signal is, on the other hand, only influenced by the second and third resistance of the respective voltage divider. These can be selected such that the input voltage range, e.g., of a down stream digital-analog converter stage is used as well as possible. The DC voltage component can, e.g., can be set to half the reference voltage of the analog-digital converter.

In one embodiment, the second resistance of the first voltage divider can be designed as the resistance of the first low-pass filter. Furthermore, the first low-pass filter can have a low-pass capacitance which is arranged between the positive signal output and the ground connection. In one embodiment, the second resistance of the second voltage divider can be designed as a resistance of the second low-pass filter. In addition, the second low-pass filter can have a low-pass capacitance that is arranged between the negative signal output and the ground connection. This enables high-frequency interferences to be filtered out of the sensor signals with a simple RC low-pass filter.

In one embodiment, the first low-pass filter can at least in part be integrated into the voltage divider. Furthermore, the second low-pass filter can at least in part be integrated into the second voltage divider.

In one embodiment, the resistance network can at least in part be integrated into the first voltage divider and the second voltage divider.

If the components of individual elements of the signal processing device are also used in further elements of the signal processing device, the number of components and thus the complexity of the signal processing device can be reduced.

In one embodiment, the resistance network can have a first network resistance which is coupled to the supply connection and to the third resistance of the first voltage divider and to the third resistance of the second voltage divider. Furthermore, the resistance network can have a second network resistance which is coupled to the ground connection and to the third resistance of the first voltage divider and to the third resistance of the second voltage divider. This enables a very simple adjustment of the DC voltage potential at the signal outputs.

In one embodiment, the signal processing device has a first input capacitance which is arranged between the positive signal input and the ground connection. Furthermore, the signal processing device can have a second input capacitance which is arranged between the negative signal input and the ground connection. The capacitances are particularly dimensioned in such a way that they do not allow signals at the prescribed signal frequency to pass. These capacitances consequently represent a short circuit to ground for signals which have a substantially higher frequency than the prescribed signal frequency. Such high-frequency interferences can, e.g., be electrostatic discharges or the like and are therefore dampened at the input of the signal processing device.

The embodiments and modifications mentioned above can be combined arbitrarily with one another, provided the combination is useful. Further possible embodiments, modifications and implementations of the invention also do not comprise explicitly mentioned combinations of features of the invention described above or below with respect to the exemplary embodiments. The person skilled in the art can particularly add individual aspects as improvements or enhancements to the respective basic form of the present invention.

BRIEF DESCRIPTION OF THE DRAWINGS

The present invention is explained below with the aid of the exemplary embodiments depicted in the schematic figures of the drawings. In the drawings.

In all of the figures, identical or respectively functionally identical elements and devices are provided with the same reference signs, provided nothing else is indicated.

DETAILED DESCRIPTION

Figure 1:
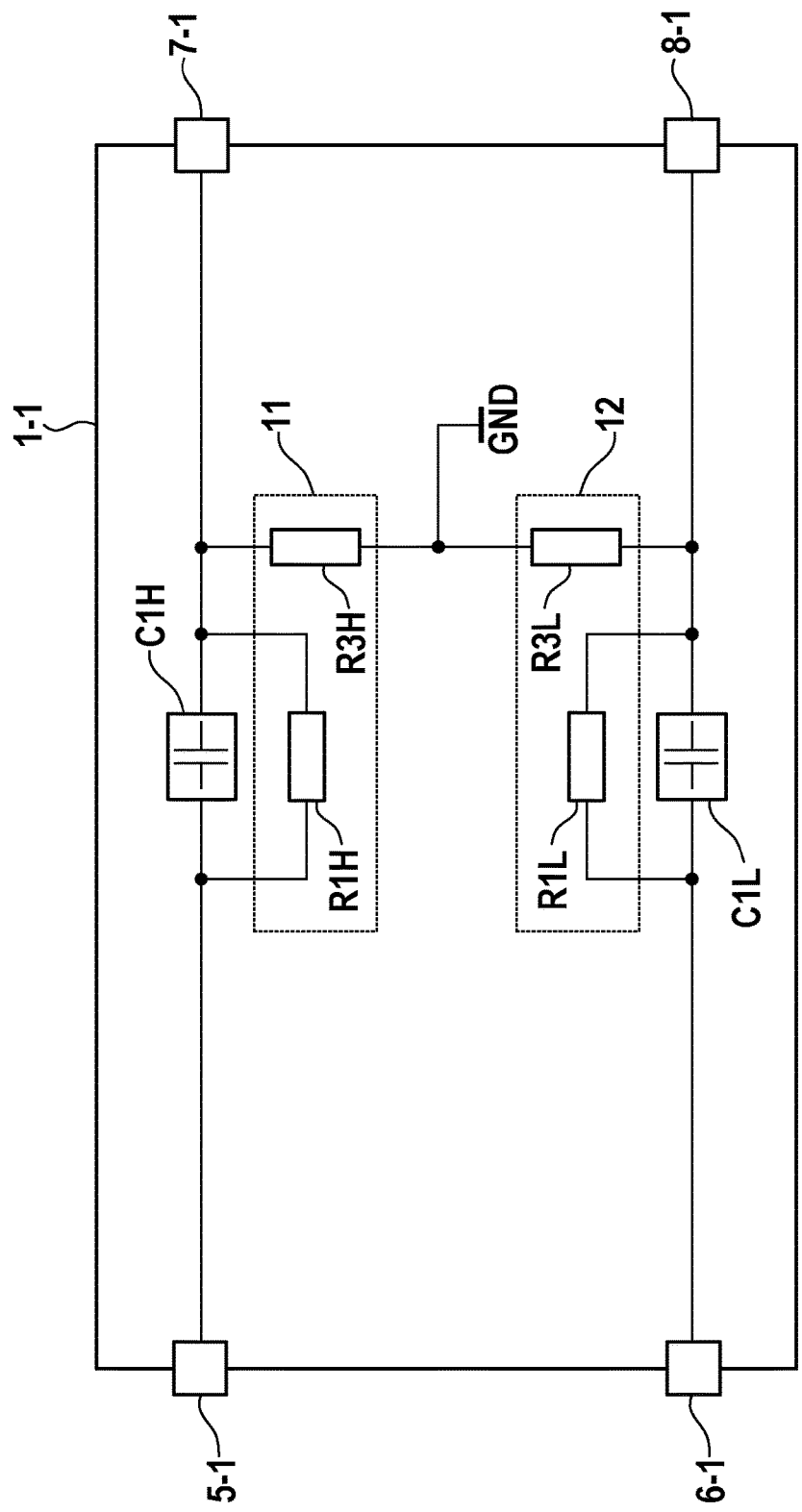
FIG. 1 shows a block diagram of an embodiment of a signal processing device according to the invention.

FIG. 1 shows a block diagram of an embodiment of a signal processing device 1-1 according to the invention.

The signal processing device 1-1 has a positive signal input 5-1 and a negative signal input 6-1. The signal processing device 1-1 can be coupled to a sensor (not explicitly depicted) via these signal inputs 5-1 and 6-1. The signal processing device 1-1 has a first signal path from the positive signal input 5-1 to a positive signal output 7-1 and a second signal path from the negative signal input 6-1 to a negative signal output 8-1.

A frequency-dependent resistance C1H, C1L is disposed in each of the signal paths. This can, e.g., be designed as a capacitor C1H, C1L. The frequency-dependent resistance C1H, C1L is dimensioned in each case in such a way that said resistance allows signals of the prescribed frequency 4 to pass in an approximately unattenuated fashion or respectively transfers the same in an approximately undamped manner.

A first resistance R1H, R1L is disposed in each case in parallel to the capacitor C1H, C1L. A third resistance R3H, R3L is in each case connected to ground between the parallel circuit consisting of capacitor C1H, C1L and the first resistance R1H, R1L. The denotations first and third are only used to note the difference and do not depict any sequence or ranking.

The two resistances R1H, R3H and R1L, R3L form in each case a voltage divider 11 and 12. The voltage dividers 11 and 12 are used to transmit the DC voltage component in the signals, which are received via the signal inputs 5-1, 6-1, in a very strongly reduced manner to the signal outputs 7-1, 8-1. The voltage divider can divide the DC voltage components in each case, e.g., in a ratio of 1/3.

It can be seen that the AC voltage components are simultaneously outputted at the prescribed frequency 4 approximately unchanged via the capacitors C1H, C1L to the signal outputs 7-1, 8-1.

Figure 2:
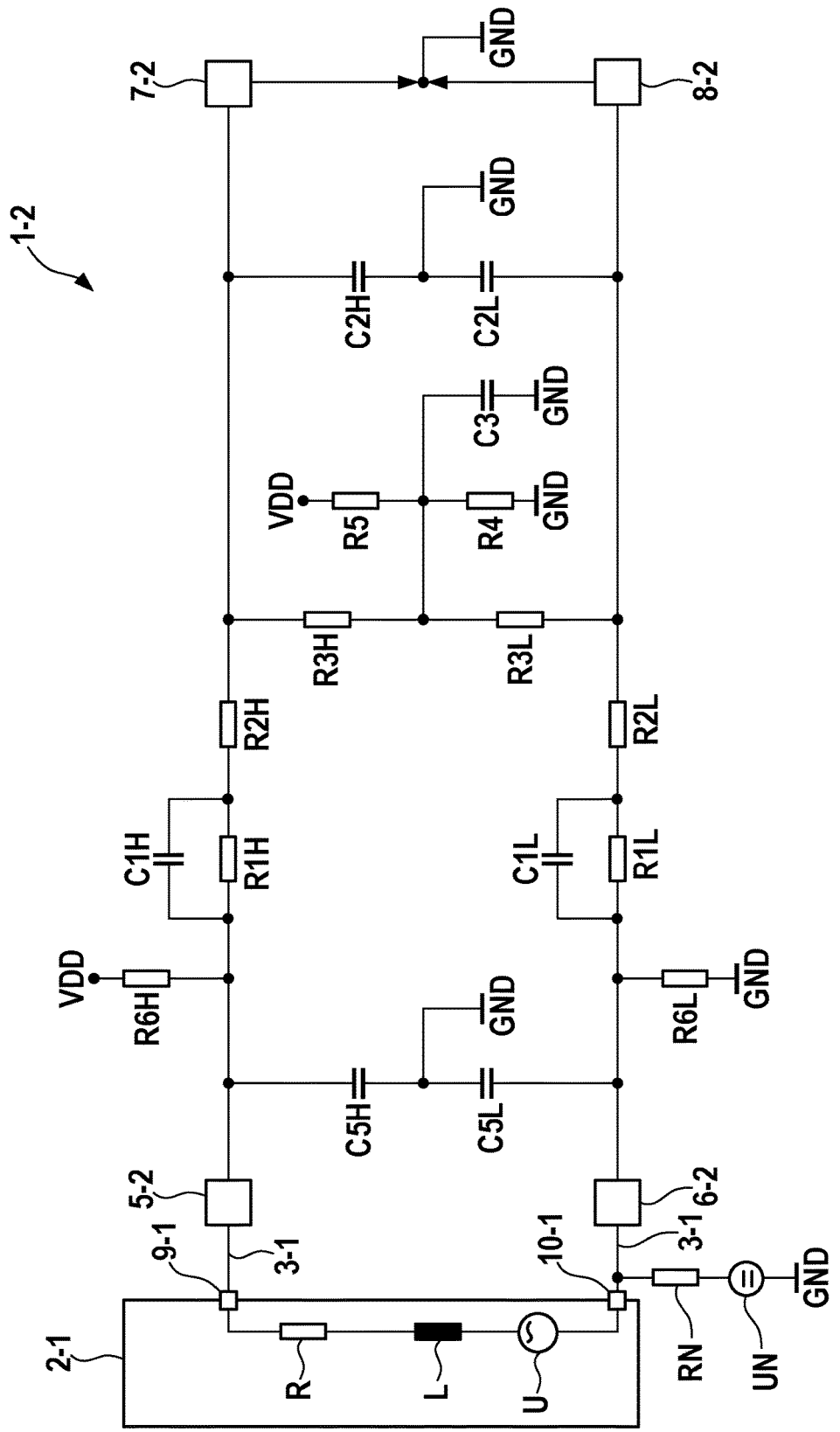
FIG. 2 shows a circuit diagram of a further embodiment of a signal processing device according to the invention.

FIG. 2 shows a circuit diagram of a further embodiment of a signal processing device according to the invention, which is coupled to a sensor 2-1. The sensor 2-1 is depicted as a combination of a voltage source U having an inductance L and a resistance R. This equivalent circuit diagram is only used to illustrate the sensor 2-1 and can deviate from the sensor depicted here depending on the sensor 2-1 used in other embodiments.

The sensor 2-1 has a positive and a negative sensor output 9-1, 10-1. The sensor 2-1 transmits a differential signal 3-1, with which the voltage difference between the two signal lines represents the actual information, to the signal processing device 1-2.

The differential signal 3-1 is conveyed to the signal processing device 1-2 via a positive and a negative signal input 5-2, 6-2. The signal processing device 1-2 has two signal paths, which are substantially symmetrically constructed and which couple the signal inputs 5-2, 6-2 to corresponding signal outputs 7-2, 8-2.

After the signal inputs 5-2, 6-2, respectively one capacitor C5H, C5L is connected to ground in each of the signal branches. The capacitors C5H, C5L are dimensioned such that signals or respectively voltages at the prescribed frequency 4 are transferred unchanged or respectively undamped in the signal path. The capacitors C5H, C5L thus have such a small capacity that said capacity represents a large resistance for the voltages at the prescribed frequency 4. The capacitors C5H, C5L are consequently used to conduct away high-frequency interference signals, which have a frequency larger than the prescribed frequency 4.

A resistance R6H is connected to the supply voltage VDD after the capacitors C5H, C5L in the signal path of the positive signal input 5-2. A resistance R6L is connected to ground GND in the signal path of the negative signal input 6-2. These resistances R6H, R6L serve to limit the changes in the DC voltage potential at the signal inputs 9-1, 10-1 in the case of a shunt. In addition, a diagnosis of the line interruption in the signal paths is made possible because the signal paths are then drawn onto different DC voltage levels.

Respectively one parallel circuit consisting of a resistance R1H, R1L and a capacitor C1H, C1L is connected in each signal branch to the capacitors C5H, C5L. A resistance R2H, R2L, which is coupled to the respective signal output 7-2, 8-2, is in turn connected to this parallel circuit. The capacitors C1H, C1L are dimensioned in such a way that they represent only a very small resistance for voltages at the prescribed frequency and represent a high resistance only for signals at a smaller frequency than the prescribed frequency 4. Signals at the prescribed signal frequency 4 consequently pass the parallel circuit substantially undamped. The value of the respective resistance R1H, R1L is critical for the signals at a smaller frequency than the prescribed frequency 4.

On the other hand, R2H also interacts with R3H as a voltage divider at the prescribed signal frequency 4. At the prescribed signal frequency 4, a dividing of the voltage at the prescribed signal frequency 4 can also be performed by the voltage divider consisting of R2H and R3H, if desired. At the prescribed signal frequency 4, the division factor is however smaller than at a DC voltage because, at a DC voltage, R1H also acts in addition to R2H. The same applies particularly to the interaction of R2L and R3L with R1L.

A resistance R3H, R3L is disposed between the resistances R2H, R2L and the respective signal output 7-2, 8-2 in each signal path, said resistance being coupled to the corresponding resistance R3L, R3H of the other signal path. At the node between the resistances R3H and R3L, a resistance R5 is connected to the supply voltage VDD and a resistance R4 to ground GND. The DC voltage potential can be adjusted at the signal outputs 7-2, 8-2 with this voltage divider between VDD and GND. A capacitor C3 between the node between the resistances R3H and R3L and GND is used to stabilize the voltage of the voltage divider at the prescribed signal frequency 4.

Finally, a capacitor C2H, C2L is disposed in each case in each signal branch between the corresponding signal output 7-2, 8-2 and ground. In each case, these capacitors C2H, C2L form together with the resistances R2H, R2L a low-pass filter. This low-pass filter is dimensioned in such a way that it allows signals at the prescribed frequency to pass, i.e. conducts said signals to the signal outputs 7-2, 8-2 and dampens signals at a higher frequency, i.e. discharges to ground.

Figure 3:
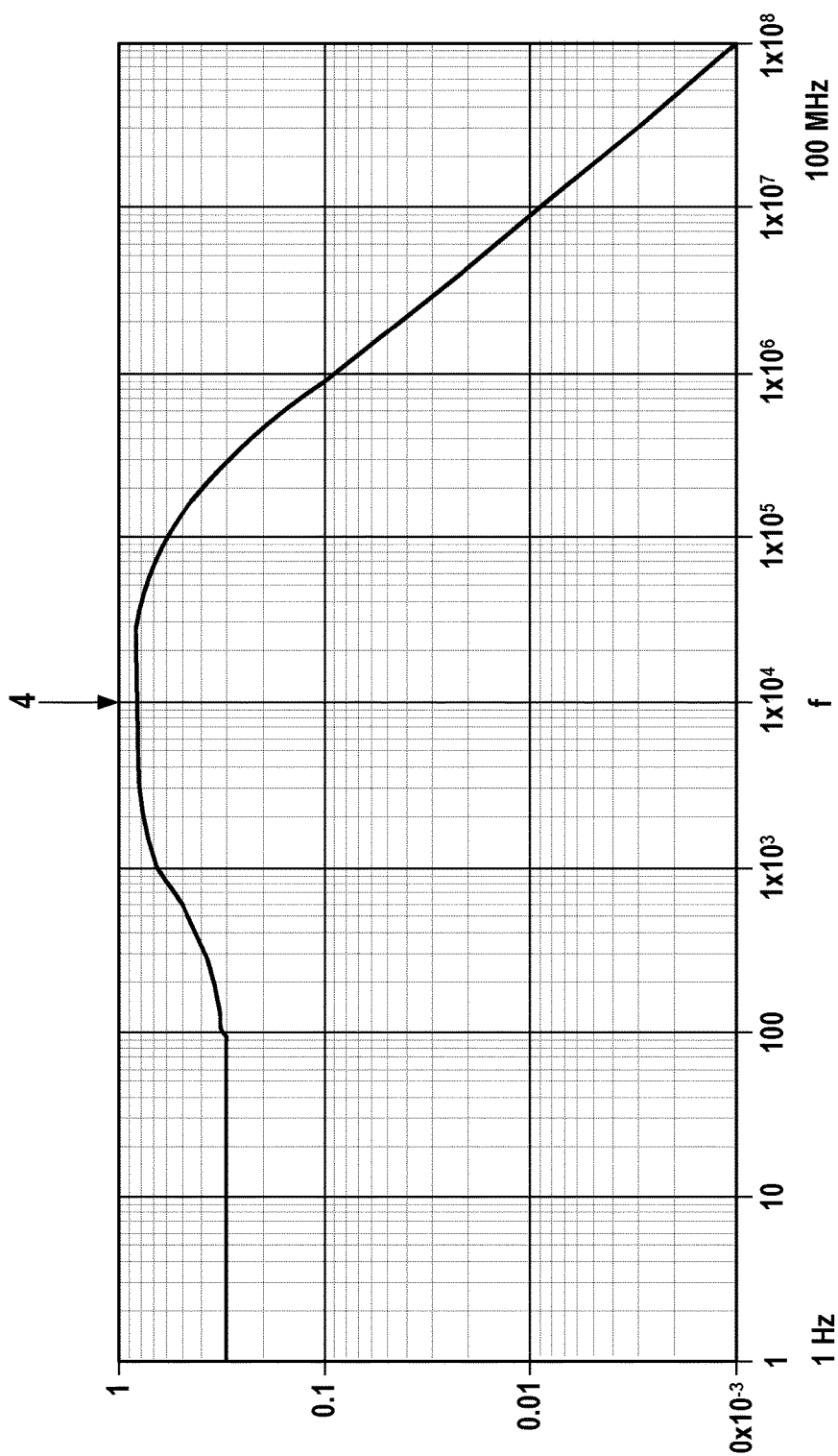
FIG. 3 shows a diagram having a frequency profile of an embodiment of a signal processing device according to the invention.

FIG. 3 shows a diagram having an exemplary frequency profile of the embodiment of the inventive signal processing device of FIG. 2. The ordinate axis of the diagram indicates the amplitude response of the signal. The abscissa axis indicates the frequency.

It can be seen in the diagram that signals at a frequency of approximately 1 kHz to 100 kHz are transmitted with less damping. Signals at a frequency under 1 KHz are approximately damped by one half. Signals at a frequency of more than 100 KHz are, on the other hand, more strongly damped with rising frequency. The damping of these signals corresponds to the damping of an RC low-pass filter.

The signal processing device 1-2 according to the invention therefore conducts the signals at the prescribed frequency 4 very well and at the same time significantly dampens signals at frequencies which lie under 1 KHz or over 100 KHZ.

In addition, signals having a direct current component, i.e. a frequency of 0, are not completely damped, which would be the case with a purely capacitive coupling between sensor and evaluation circuit. In fact, low-frequency signal components including the direct current component are transmitted at a constant transmission factor above the frequency. In contrast to the sinking transmission at a sinking frequency in the case of a pure high-pass filter. A diagnosis of faults, such as, e.g. shunt or short circuit is consequently very easily possible.

Figure 4:
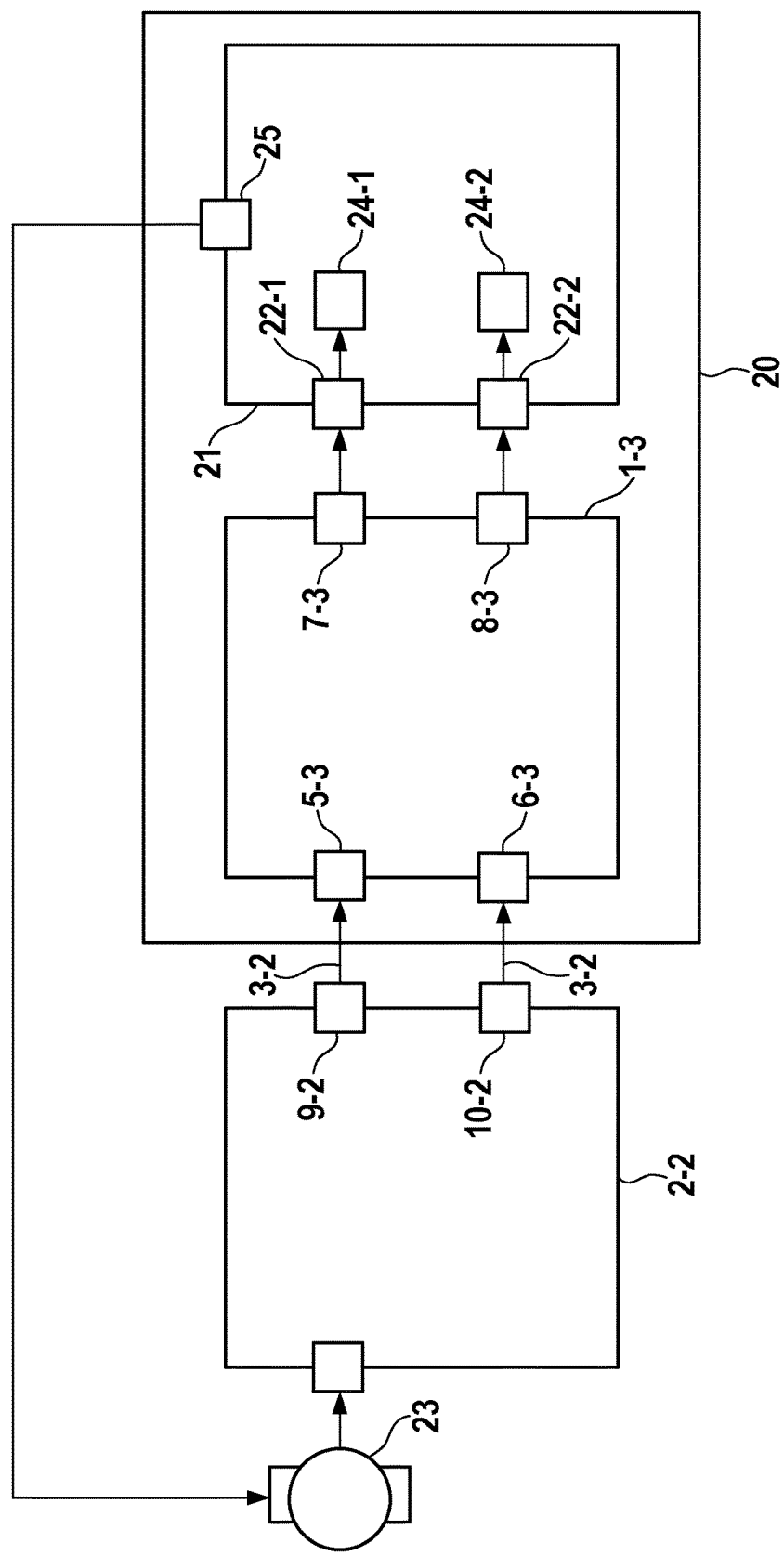
FIG. 4 shows a block diagram of an embodiment of a control device according to the invention.

FIG. 4 shows a block diagram of an embodiment of a control device 20 according to the invention.

The control device 20 comprises a computing device 21 which is designed to control a motor 23 via a control output. The movement of the motor 23 is sensed by a sensor 2-2 which outputs a differential AC voltage signal 3-2 to the signal processing device 1-3 or to a positive signal input 5-2 and a negative signal input 6-3 of the signal processing device 1-3 via a positive and a negative e sensor output 9-2, 10-2. The signal processing device 1-3 outputs the processed signals via signal inputs 22-1, 22-2 to an analog-digital converter 24-1, 24-2 of the computing device 21, which digitizes the signals.

The digitized signals can be used in the computing device 21 in order to determine the position of the rotor of the electric motor 23 and to generate corresponding control signals.

Although the present invention was described above using preferred exemplary embodiments, said invention is not limited thereto but can be modified in a variety of ways. The invention can particularly be changed or modified in a variety of ways without deviating from the gist of the invention.

The present invention can, e.g., also be used for the signal processing of signals in audio applications or something similar.

The invention claimed is:

1. A signal processor (1-1, 1-2, 1-3) for processing a differential signal (3-1, 3-2) of a sensor (2-1, 2-2) at a prescribed signal frequency (4), the signal processor (1-1, 1-2, 1-3) comprising:
 a positive signal input (5-1, 5-2, 5-3), coupled to a positive sensor output (9-1, 9-2) of the sensor (2-1, 2-2),
 a negative signal input (6-1, 6-2, 6-3), coupled to a negative sensor output (10-1, 10-2) of the sensor (2-1, 2-2),
 a positive signal output (7-1, 7-2, 7-3),
 a negative signal output (8-1, 8-2, 8-3),
 a first frequency-dependent resistance (C1H) between the positive signal input (5-1, 5-2, 5-3) and the positive signal output (7-1, 7-2, 7-3),
 a second frequency-dependent resistance (C1L) between the negative signal input (6-1, 6-2, 6-3) and the negative signal output (8-1, 8-2, 8-3),
 a voltage supply connection (VDD) and a ground connection (GND);
 wherein the first and the second frequency-dependent resistance (C1H, C1L) are configured to allow electrical signals at the prescribed signal frequency (4) to pass in unattenuated fashion,
 a first voltage divider (11), one or more components of the first voltage divider connected in parallel with the first frequency-dependent resistance (C1H) and configured to divide a voltage between the positive signal input (5-1, 5-2, 5-3) and the positive signal output (7-1, 7-2, 7-3) using a predetermined ratio,
 a second voltage divider (12), one or more components of the second voltage divider connected in parallel with the second frequency-dependent resistance (C1L) and configured to divide a voltage between the negative signal input (6-1, 6-2, 6-3) and the negative signal output (8-1, 8-2, 8-3) using a predetermined ratio, and
 a resistance network, disposed between the first voltage divider (11) and the second voltage divider (12) and the voltage supply connection (VDD) and the ground connection (GND), the resistance network configured to adjust a DC voltage at the positive signal output (7-1, 7-2, 7-3) and the negative signal output (8-1, 8-2, 8-3) to a prescribed value.

2. The signal processor (1-1, 1-2, 1-3) according to claim 1, further comprising a first low-pass filter, which is electrically disposed between the positive signal input (5-1, 5-2, 5-3) and the positive signal output (7-1, 7-2, 7-3) and is configured to allow electrical signals at the prescribed signal frequency (4) to pass, and a second low-pass filter, electrically disposed between the negative signal input (6-1, 6-2, 6-3) and the negative signal output (8-1, 8-2, 8-3) and is configured to allow signals at the prescribed signal frequency (4) to pass.

3. The signal processor (1-1, 1-2, 1-3) according to claim 1,
wherein the resistance network is integrated at least in part into the first voltage divider (11) and the second voltage divider (12).

4. The signal processor (1-1, 1-2, 1-3) according to claim 1,
wherein a first resistance (R1H) of the first voltage divider (11) is disposed in parallel to the frequency-dependent resistance (C1H), and wherein a second resistance (R2H) of the first voltage divider (11) is disposed between the first resistance (R1H) of the first voltage divider (11) and the positive signal output (7-1, 7-2, 7-3), and wherein a third resistance (R3H) of the first voltage divider (11) is disposed between the second resistance (R2H) of the first voltage divider (11) and a ground connection (GND; and
wherein a first resistance (R1L) of the second voltage divider (12) is disposed in parallel to the second frequency-dependent resistance (C1L), and wherein a second resistance (R2L) of the second voltage divider (12) is disposed between the first resistance (R1L) of the second voltage divider (12) and the negative signal output (8-1, 8-2, 8-3), and wherein a third resistance (R3L) of the second voltage divider (12) is disposed between the second resistance (R2L) of the second voltage divider (12) and a ground connection (GND).

5. A control device (20) for an electric machine (23),
comprising a signal processor (1-1, 1-2, 1-3) according to claim 1, and
comprising a computing device (21), having a first analog-digital converter, coupled to the positive signal output (7-1, 7-2, 7-3) of the signal processing device (1-1, 1-2, 1-3), said computing device having a second analog-digital converter, coupled to the negative signal output (8-1, 8-2, 8-3) of the signal processing device (1-1, 1-2, 1-3).

6. The signal processor (1-1, 1-2, 1-3) according to claim 1,
wherein a first resistance (R1H) of the first voltage divider (11) is disposed in parallel to the frequency-dependent resistance (C1H), and wherein a second resistance (R2H) of the first voltage divider (11) is disposed between the first resistance (R1H) of the first voltage divider (11) and the positive signal output (7-1, 7-2, 7-3), and wherein a third resistance (R3H) of the first voltage divider (11) is disposed between the second resistance (R2H) of the first voltage divider (11) and a ground connection (GND).

7. The signal processor (1-1, 1-2, 1-3) according to claim 1,
wherein a first resistance (R1L) of the second voltage divider (12) is disposed in parallel to the second frequency-dependent resistance (C1L), and wherein a second resistance (R2L) of the second voltage divider (12) is disposed between the first resistance (R1L) of the second voltage divider (12) and the negative signal output (8-1, 8-2, 8-3), and wherein a third resistance (R3L) of the second voltage divider (12) is disposed between the second resistance (R2L) of the second voltage divider (12) and a ground connection (GND).

8. The signal processor (1-1, 1-2, 1-3) according to claim 2,
Wherein at least a portion of the first low-pass filter is integrated into the first voltage divider (11), and wherein at least a portion of the second low-pass filter is integrated into the second voltage divider (12).

9. The signal processor (1-1, 1-2, 1-3) according to claim 4,
wherein the second resistance (R2H) of the first voltage divider (11) is configured as a resistance (R2H) of the first low-pass filter, and wherein the first low-pass filter has a low-pass capacitance (C2H), disposed between the positive signal output (7-1, 7-2, 7-3) and the ground connection (GND), and
wherein the second resistance (R2L) of the second voltage divider (12) is configured as a resistance (R2L) of the second low-pass filter, and wherein the second low-pass filter has a low-pass capacitance (C2L), disposed between the negative signal output (8-1, 8-2, 8-3) and the ground connection (GND).

10. The signal processor (1-1, 1-2, 1-3) according to claim 4,
wherein the resistance network has a first network resistance (R5), coupled to the supply connection (VDD) and to the third resistance (R3H) of the first voltage divider (11) and the third resistance (R3L) of the second voltage divider (12), and
wherein the resistance network has a second network resistance (R5), coupled to the ground connection (GND) and to the third resistance (R1H) of the first voltage divider (11) and the third resistance (R1L) of the second voltage divider (12).

11. The signal processor (1-1, 1-2, 1-3) according to claim 4,
having a first input capacitance (C5H), disposed between the positive signal input (5-1, 5-2, 5-3) and the ground connection (GND), and
having a second input capacitance (C5L), disposed between the negative signal input (6-1, 6-2, 6-3) and the ground connection (GND).

* * * * *